United States Patent
Wang et al.

(10) Patent No.: US 6,533,597 B1
(45) Date of Patent: Mar. 18, 2003

(54) ELECTRICAL CONNECTOR HAVING IMPROVED HOUSING STRUCTURE

(75) Inventors: Jwomin Wang, Hsi-Dan (TW); Yao-Chi Huang, Tu-Chen (TW); Genn-Sheng Lee, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/091,679

(22) Filed: Mar. 4, 2002

(30) Foreign Application Priority Data

Dec. 26, 2001 (TW) .................................... 90222989 U

(51) Int. Cl.⁷ .......................................... H01R 13/625
(52) U.S. Cl. ...................... 439/342; 439/70; 439/259
(58) Field of Search ............................... 439/342, 343, 439/259, 525, 70, 71, 266

(56) References Cited

U.S. PATENT DOCUMENTS

| | | | | |
|---|---|---|---|---|
| 5,492,488 A | * | 2/1996 | Hsu | 439/342 |
| 5,562,474 A | * | 10/1996 | Lee | 439/259 |
| 6,152,757 A | * | 11/2000 | Szu | 439/342 |
| 6,186,817 B1 | * | 2/2001 | Szu | 439/342 |
| 6,280,223 B1 | * | 8/2001 | Lin | 439/342 |
| 6,371,782 B1 | * | 4/2002 | Ohashi | 439/264 |
| 6,406,317 B1 | * | 6/2002 | Li et al. | 439/259 |

* cited by examiner

Primary Examiner—Tho D. Ta
Assistant Examiner—Edwin A. León
(74) Attorney, Agent, or Firm—Wei Te Chung

(57) ABSTRACT

An electrical connector for electrically connecting pins of an external electrical device with a printed circuit board comprises an insulative housing, a plurality of contact-receiving passages defined in the insulative housing, and a plurality of contacts secured in corresponding contact-receiving passages. The insulative housing has stopping blocks which are positioned beside the contact-receiving passages for blocking the pins of the external electrical device.

11 Claims, 4 Drawing Sheets

ELECTRICAL CONNECTOR HAVING IMPROVED HOUSING STRUCTURE

BACKGROUND OF THE INVENTION

1. Field of the Invention

The present invention relates to electrical connectors, and more particularly to an electrical connector having improved housing structure for electrically connecting a central processing unit (CPU) to a printed circuit board (PCB).

2. Description of the Prior Art

Conventional CPU sockets have contacts for electrically connecting CPUs to PCBs. Tail portions of the contacts are soldered to the PCBs, and receiving portions of the contacts are electrically mated with pins of the CPUs. During CPUs mating with the sockets, the pins of the CPUs are inserted into the CPU sockets with zero insertion force, i.e., the pins of the CPUs do not contact with the contacts. Then, the pins of the CPUs are actuated to engage with the contacts of the CPU sockets. The pins engage with the resiliently deformed contacts. Example of such a conventional CPU socket is disclosed in U.S. Pat. No. 6,152,757 as shown in FIGS. 5 and 6. The socket has a housing 4 with a plurality of slots 41 opened therein. A plurality of contact-receiving passages 42 is formed in the slots 41 for receiving corresponding contacts 6. Initially, CPU pins 5 are inserted into the socket without contacting with the contacts 6. Then, the CPU pins 5 are actuated to engage with the contacts 6 along a direction indicated by V, therefore the contacts 6 are electrically connected with the CPU pins 5. However, because there is no stop to block the pins 5, when the CPU pins 5 are under an undesired shock, and when the shock force is just loaded along the direction indicated by V, friction between the CPU pins 5 and the contacts 6 is too small to resist the shock force, the CPU pins 5 may move further and are positioned in undesired places indicated by broken-line. This may result in failure of electrical connection between the CPU pins 5 and the contacts 6. Further, the CPU pins 5 disconnected from the contacts 6 are needed to be actuated along a direction indicated by V', then the CPU pins 5 which are positioned in the wrong places may press the contacts 6, and this result in plastic deformation and even damage of the contacts 6.

Accordingly, a CPU socket with improved structure is desired to overcome the shortcoming of the conventional CPU socket.

SUMMARY OF THE INVENTION

An object of the present invention is to provide an electrical connector having improved housing structure for electrically connecting a central processing unit (CPU) to a printed circuit board (PCB).

To achieve the above object, a connector for electrically connecting pins of an external electrical device with a printed circuit board comprises an insulative housing, a plurality of contact-receiving passages defined in the insulative housing, and a plurality of contacts secured in corresponding contact-receiving passages. The insulative housing has stopping blocks which are positioned beside the contact-receiving passages for blocking the pins of the external electrical device.

Other objects, advantages and novel features of the present invention will be drawn from the following detailed description of preferred embodiments of the present invention with attached drawings, in which:

DESCRIPTION OF PREFERRED EMBODIMENTS OF THE INVENTION

The present invention will be explained in detail by reference to the following description of the preferred embodiments.

Figure 1:
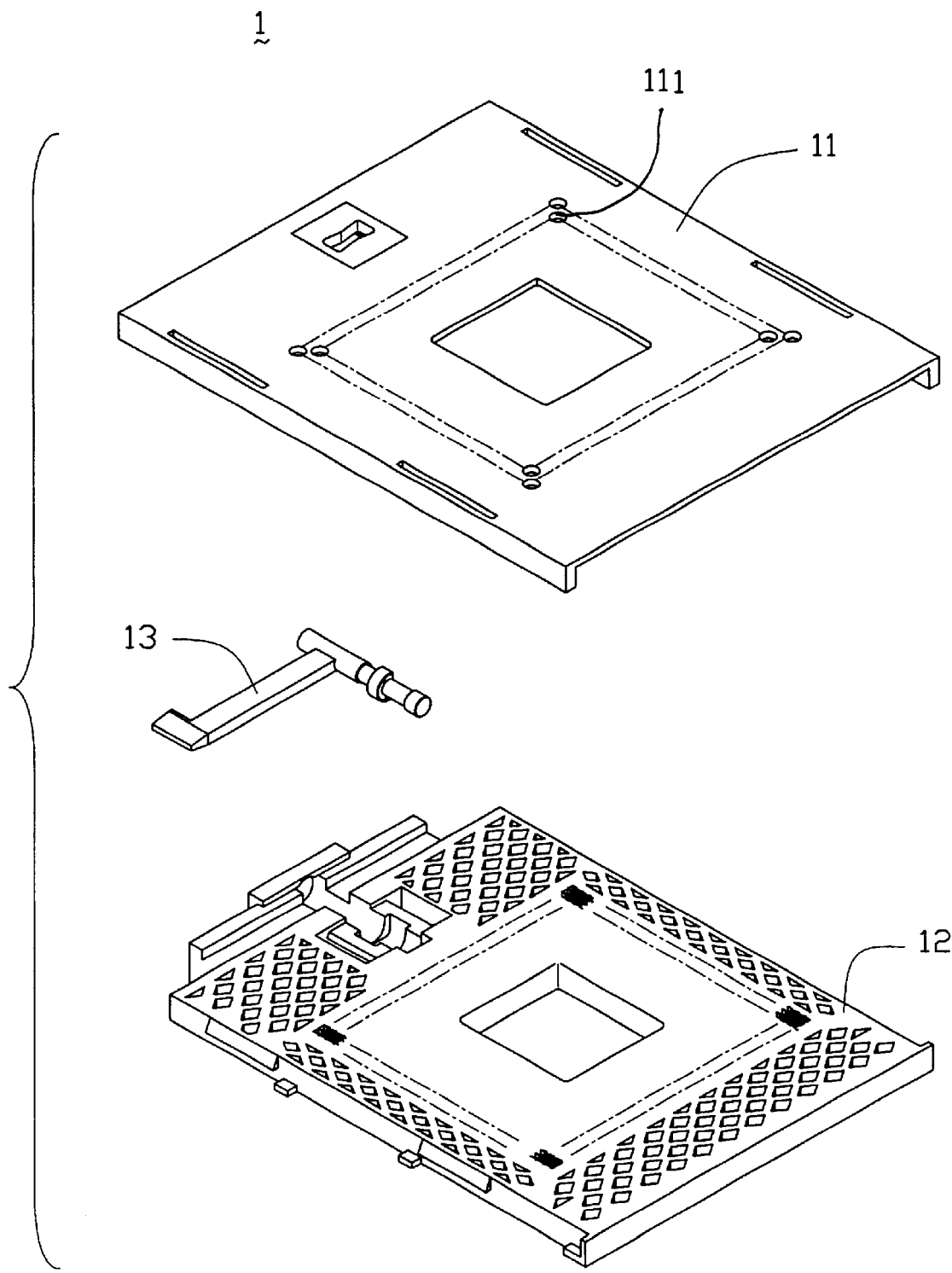
FIG. 1 is an exploded view of a CPU socket in accordance with a first embodiment of the present invention.
Figure 2:
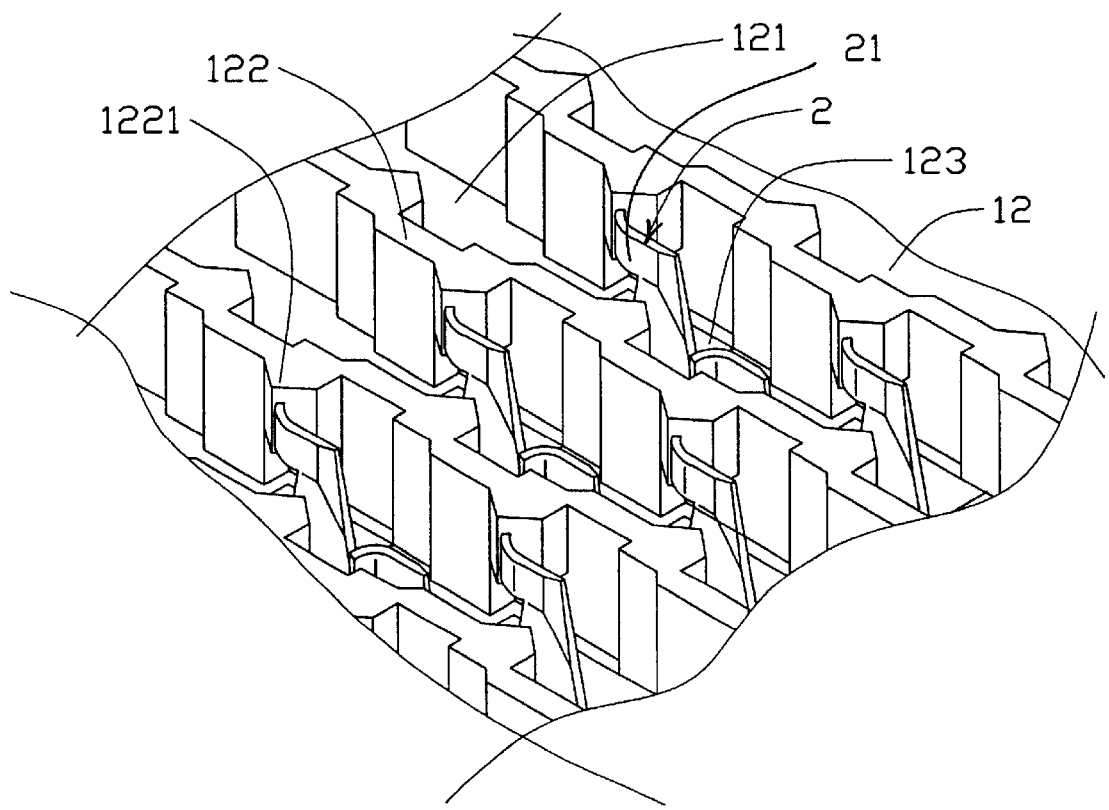
FIG. 2 is a fragmentary perspective view of the CPU socket of FIG. 1.

As shown in FIGS. 1 and 2, a CPU socket 1 in accordance with a preferred embodiment of the present invention comprises an insulative housing 12, a cover 11, with through holes 111 therein, slidable on the insulative housing 12, and an actuation device 13 for actuating the cover 11 to slide on the insulative housing 12. The insulative housing 12 has a plurality of slots 121 and blocks 122. A plurality of contact-receiving passages 123 is spaced apart in communication with the slots 121 along two lines for securing corresponding contacts 2 in the passageways, respectively. The blocks 122 are positioned between the slots 121 for separating the slots 121 apart. A plurality of triangular-shaped stopping walls 1221 is formed on the blocks 122 corresponding to the contact-receiving passages 123.

Figure 3:
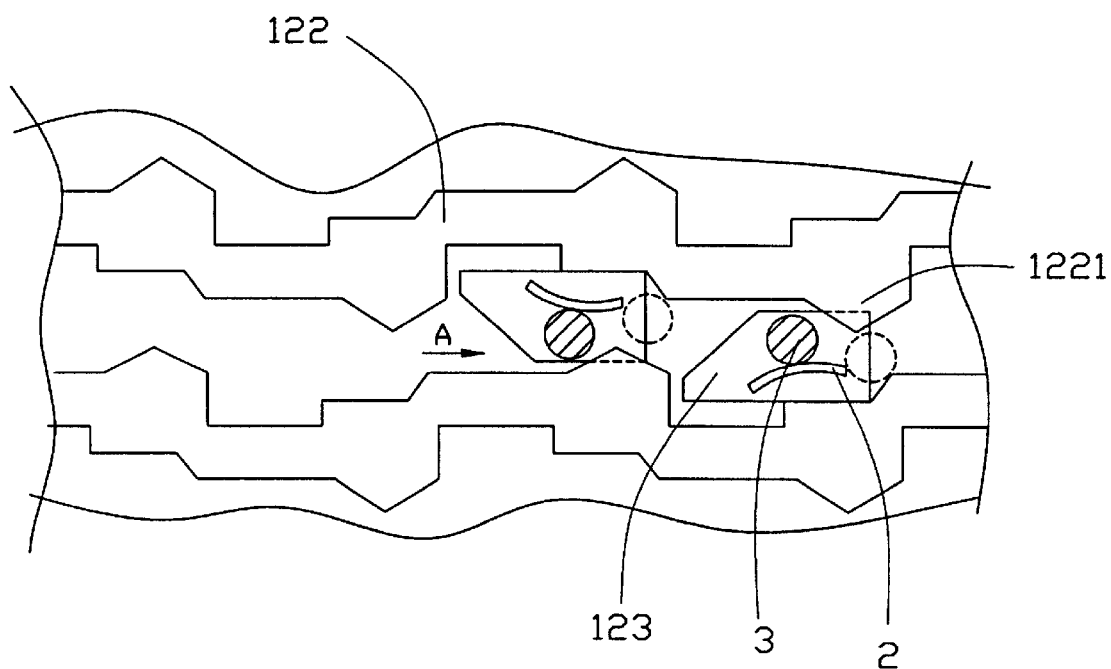
FIGS. 3 is a fragmentary top view of the CPU socket in accordance with the first embodiment of the present invention.

Referring to FIG. 3, CPU pins 3 are inserted, through the through holes 111 in the cover 11, in the slots 121 and are actuated to engage with the contacts 2 of the CPU socket 1 along direction A. When the CPU pins 3 are subject to an undesired shock, the CPU pins 3 are inclined to deviate to a wrong place indicated by broken-line. Because the gaps between the contacts 2 and the stopping walls 1221 are smaller than diameters of the CPU pins 3, when the CPU pins 3 tend to move to the wrong places, the stopping walls 1221 can prevent the CPU pins 3 from moving to the wrong places and keep the electrical connection between the CPU pins 3 and the contacts 2, and therefore undesired damage of the contacts 2 during the disconnection from the CPU pins 3 is avoided. It is contemplated that in this embodiment similar to the aforementioned U.S. Pat. No. 6,152,757, the CPU pins are respectively engaged with the corresponding contacting portions 21, which are exposed in the slots 121, without substantially touching the housing 12, but with balanced force imposed on the CPU via the alternately arranged contacts 2.

Figure 4:
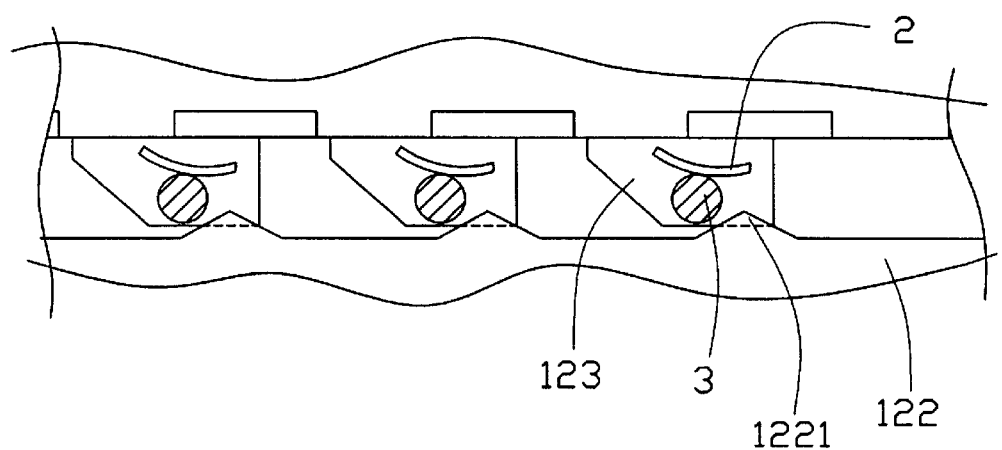
FIG. 4 is a fragmentary top view of the CPU socket in accordance with the second embodiment of the present invention.
Figure 5:
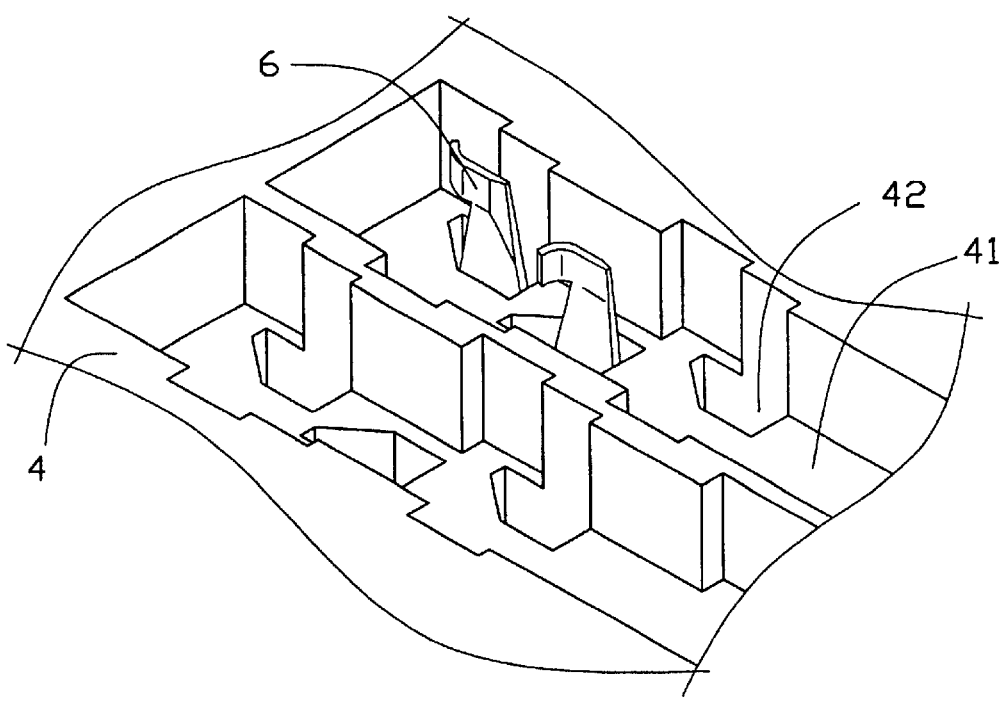
FIG. 5 is a perspective view of a conventional CPU socket.
Figure 6:
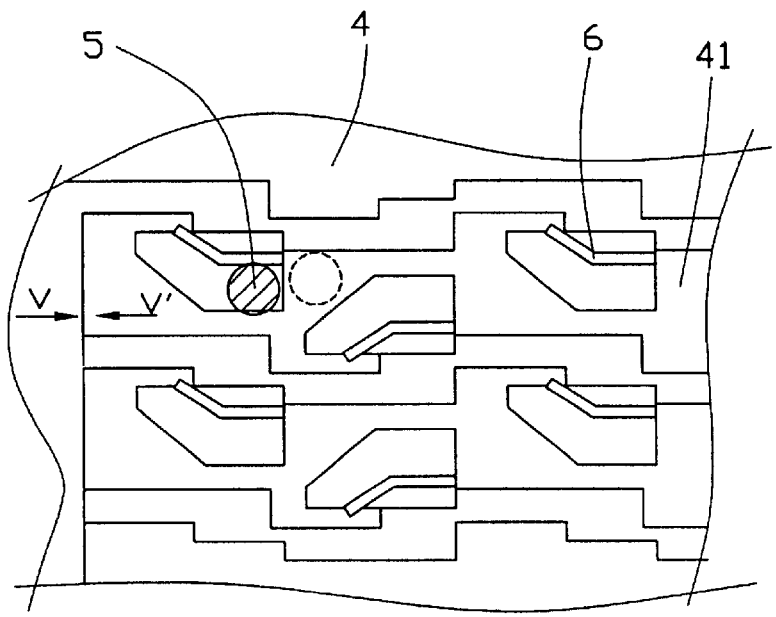
FIG. 6 is a top view of the conventional CPU socket.

FIG. 4 shows a CPU socket 1 in accordance with a second embodiment of the present invention. The CPU socket 1 is substantially identically configured, except for the location/direction of the contact-receiving passages 123. The blocks 122 have only one side defined with the stopping walls 1221 corresponding to the location of contact-receiving passages 123, therefore the stopping walls 1221 can prevent the CPU pins 3 from moving to the wrong places too.

Although the present invention has been described with reference to particular embodiments, it is not to be construed as being limited thereto. Various alterations and modifications can be made to the embodiment without in any way departing from the scope or spirit of the present invention as defined in the appended claims.

What is claimed is:

1. An electrical connector for electrically connecting pins of an external electrical device with a printed circuit board, comprising:

an insulative housing;

a plurality of contact-receiving passages defined in the housing;

a plurality of slots located above the passages and respectively in communication with the contact-receiving passages; and a plurality of contacts secured in corresponding contact-receiving passages;

wherein each of the contacts includes a contacting portion located in the correspond slot for engaging with corresponding pins of the external electrical device, and the housing has stopping blocks which are positioned laterally beside the contact-receiving passages and which project into corresponding slots toward the contacting portions of the contacts for preventing the pins of the external electrical device from being accidentally displaced.

2. The connector of claim 1, wherein the contact-receiving passages are opened along two lines as groups.

3. The connector of claim 2, wherein the stopping blocks are triangular-shaped.

4. An electrical connector assembly comprising:

an insulative housing defining a plurality of passageways therein;

a plurality of contacts retained in the corresponding passageways, respectively;

an electronic component with a plurality of pins extending downwardly, said electronic component positioned above the housing with said pins extending toward the corresponding contacts;

a plurality of stopping walls formed in the housing corresponding to but not in the passageways, respectively; wherein said pins move relative to the housing in a lengthwise direction, and said stopping walls face and block the corresponding pins along said lengthwise direction, respectively, to prevent over-moving of said pins along said lengthwise direction.

5. The assembly of claim 4, wherein said pins are only engaged with the corresponding contacts without substantially touching the housing.

6. The assembly of claim 4, wherein said contacts are alternately arranged to provide a balanced force imposed on the CPU in transverse directions perpendicular to said lengthwise direction.

7. The assembly of claim 4, wherein said housing further includes a plurality of slots located above the passageways and each in communication with the plural corresponding passageways, and said stopping walls project into the corresponding slots.

8. The assembly of claim 7, wherein each of the contacts includes a contacting portion located in the correspond slot and engaged with the corresponding pins therein.

9. An electrical connector assembly comprising:

an insulative housing;

a cover positioned on the housing and movable relative to the housing in a lengthwise direction;

a plurality of through holes defined in the cover;

a plurality of passageways defined in the housing generally in vertical alignment with the corresponding through holes, respectively;

a plurality of contacts disposed in the corresponding passageways, respectively;

an electronic package including a plurality of pins extending through the corresponding through holes and into the corresponding passageways and engaged with the corresponding contacts, respectively; and a plurality of stopping walls formed on the housing associated with and located substantially above the corresponding passageways, respectively, and confronting the corresponding contacts along said lengthwise direction, for respectively preventing over-movement of the corresponding pins relative to corresponding contacts.

10. The connector of claim 9, wherein said contacts extend above the corresponding passageways, respectively, and said stopping walls are formed above the corresponding passageways, respectively, too.

11. The connector of claim 9, wherein said contacts are alternately arranged along said lengthwise direction.

* * * * *